Feb. 17, 1970 S. C. MEYERS 3,496,072
MULTILAYER PRINTED CIRCUIT BOARD AND METHOD FOR MANUFACTURING SAME
Filed June 26, 1967 4 Sheets-Sheet 1

INVENTOR
STEVEN C. MEYERS

BY Cushman, Darby & Cushman
ATTORNEYS

INVENTOR
STEVEN C. MEYERS

BY
Cushman, Darby & Cushman
ATTORNEYS

INVENTOR
STEVEN C. MEYERS

BY
Cushman, Darby & Cushman
ATTORNEYS

INVENTOR
STEVEN C. MEYERS

BY
Cushman, Darby & Cushman
ATTORNEYS

United States Patent Office 3,496,072
Patented Feb. 17, 1970

3,496,072

MULTILAYER PRINTED CIRCUIT BOARD AND METHOD FOR MANUFACTURING SAME

Steven C. Meyers, Burnsville, Minn., assignor to Control Data Corporation, Minneapolis, Minn., a corporation of Minnesota Filed June 26, 1967, Ser. No. 648,576
Int. Cl. C23b 5/48, 7/00
U.S. Cl. 204—15 10 Claims

ABSTRACT OF THE DISCLOSURE

The present invention relates to a multilayer printed circuit board and a method of manufacturing same by employing electroforming techniques, particularly in the creation of interlayer connections. These connections between layers are prepared by selectively plating from a printed circuit layer through a removable masking arrangement to develop projecting posts.

Figure 1:
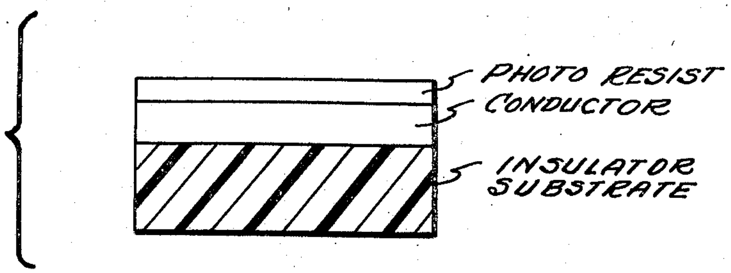

Conventionally, interconnected multilayer printed circuit boards are products of three basic techniques. The first is the stacking of a number of circuit layers, the layers being insulated from one another. The stacked arrangement is then drilled, and the bore hole is plated with a conductive metal to form the interlayer connection. However, this arrangement requires highly precisioned drilling, accurate alignment of the stacked layers, and the plating bond between layers is weak and unreliable. Also, the one-step formation of all the interlayer connections prevents the board from being inspected as each interlayer connection is formed. Therefore, the occurrence of a defect in such a construction results in the entire multilayer board being rejected.

The second approach utilizes a first etching operation to develop the posts for interconnecting the spaced layers of the board and a second etching operation to develop the printed circuitry. However, the etching approach has a number of shortcomings. For example, when the deep etch is performed so as to form the posts, there is undercutting of each post which weakens same. Compensating for such undercutting reduces the density of the circuitry which may be plated on the board and increases the problem of maintaining acceptable tolerances in the product. Furthermore, etching is relatively expensive due to the wasting of the etched metal, the cost of the etchant, and the low yield obtainable.

The third approach utilizes a multiple screening process whereby an insulating material, such as epoxy, is patterned according to the desired interlayer connections and is applied over a printed circuit. An electroforming operation is then undertaken to produce the posts. More particularly, the posts are developed in apertures formed in the insulating material to create the post pattern. The limitations of this technique include problems in aperture definition caused by the screening process and the nonremovability inadequacies of the insulating mask. With respect to the latter, such masks are usually deficient in one or more of the properties of thermal or electrical insulation, or physical strength.

The electroforming technique which characterizes the present method for fabricating multilayer printed circuits overcomes the deficiencies of prior art arrangements by improving the definition of the interlayer connectors and improving the interlayer bond, consequently permitting a higher interconnection density and higher production yield.

The present method also allows posts to begin and end within the multilayer board. Space above and below the posts may then be utilized for additional electronic circuitry on the board.

Another object of the invention is to improve the economy of multilayer board production not only by increasing the yield, but also by reducing the amount of metal required to develop the interlayer posts.

Still another object of the present invention is to allow insulations of desired characteristics to be used between layers of a multilayer board rather than relying on the material of a plating mask.

A further object is to provide a method for forming a multilayer printed circuit board in a manner which permits layer to layer inspection during fabrication to provide accurate in-process quality assurance.

Briefly, the invention comprises the steps of: forming a conductive layer of material on an insulator substrate; covering the conductive layer with a suitable masking material; developing the mask according to the desired patterns of the interlayer connectors; electroforming these connectors using the conductive layer as an electrical path in the electroforming operation; removing the mask; and insulating the conductive layer and the interlayer connectors leaving exposed surfaces at the ends of the connectors. These steps are repeated for the desired number of layers.

Figure 2:
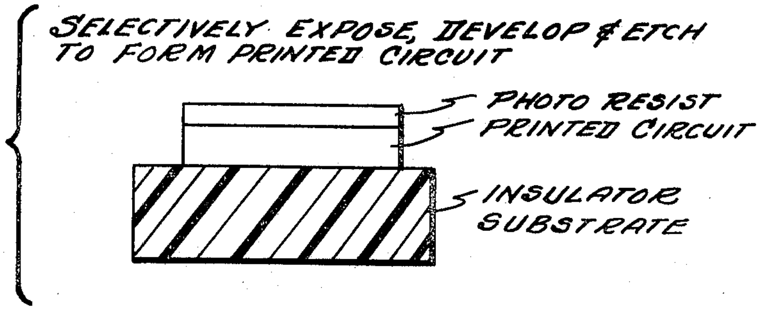
Figure 3:
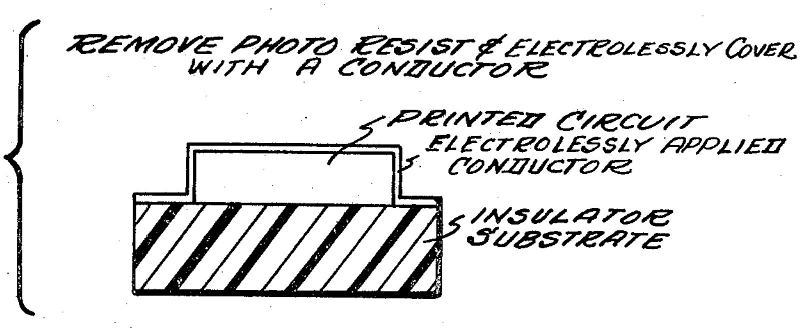
Figure 4:
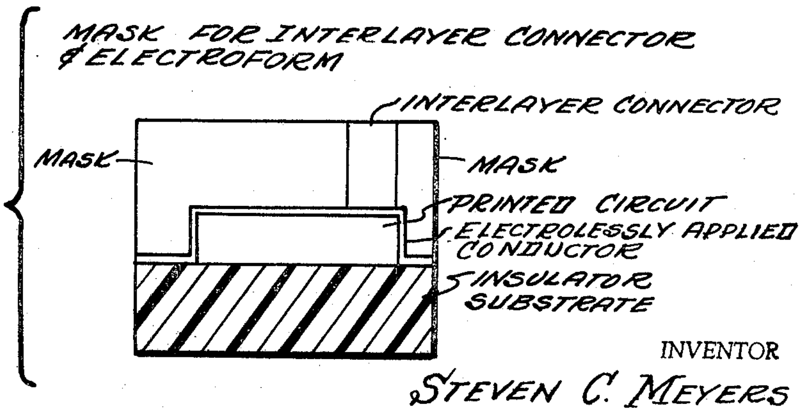
Figure 5:
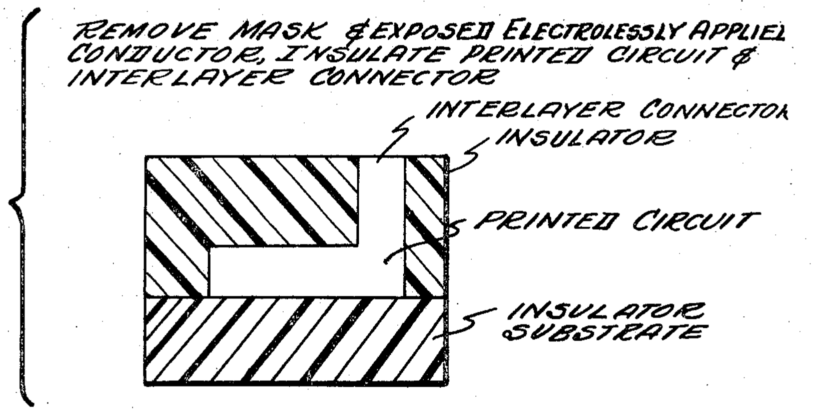
Figure 6:
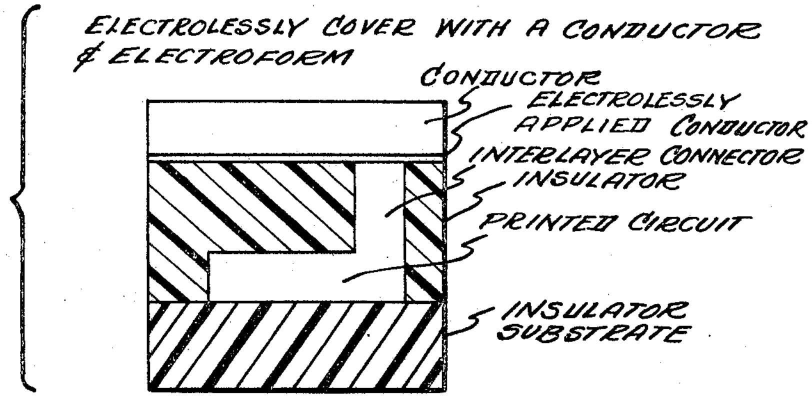
Figure 7:
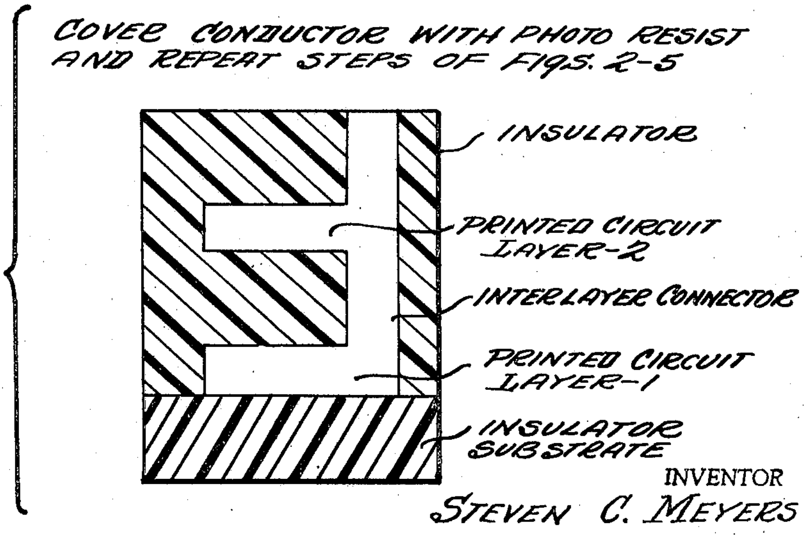
Figure 8:
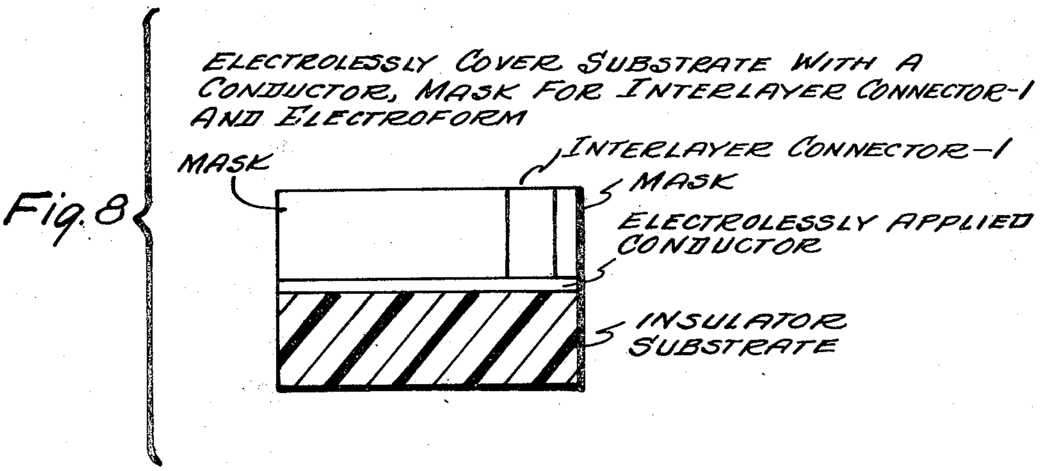
Figure 9:
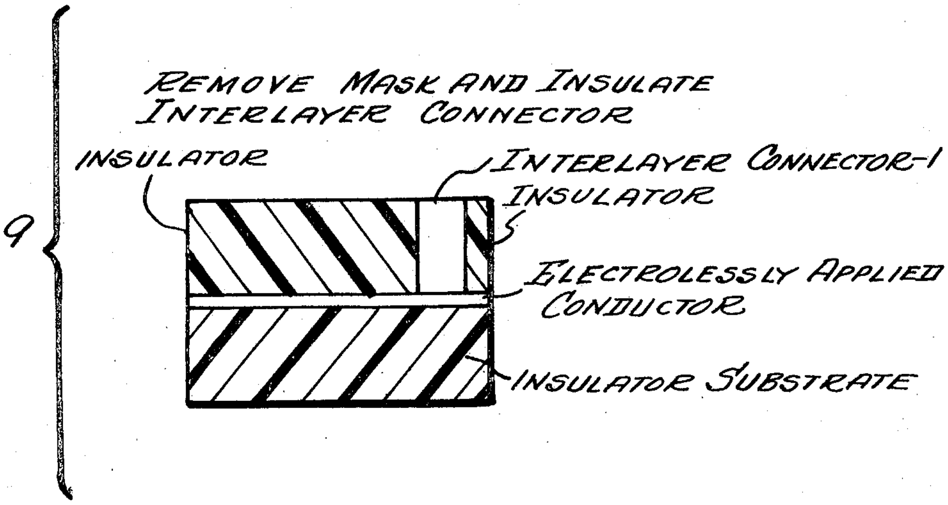
Figure 10:
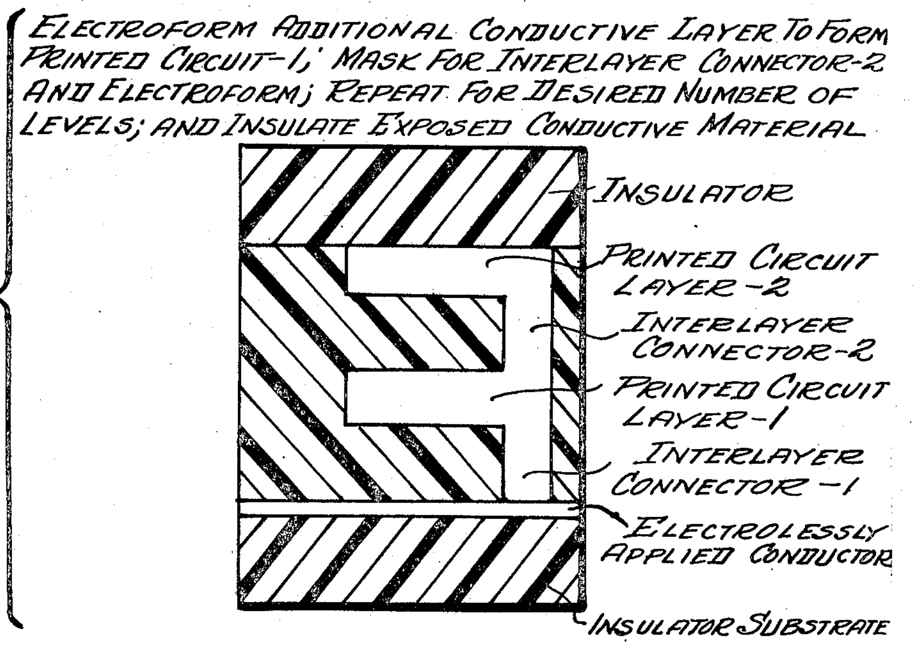
Figure 11:
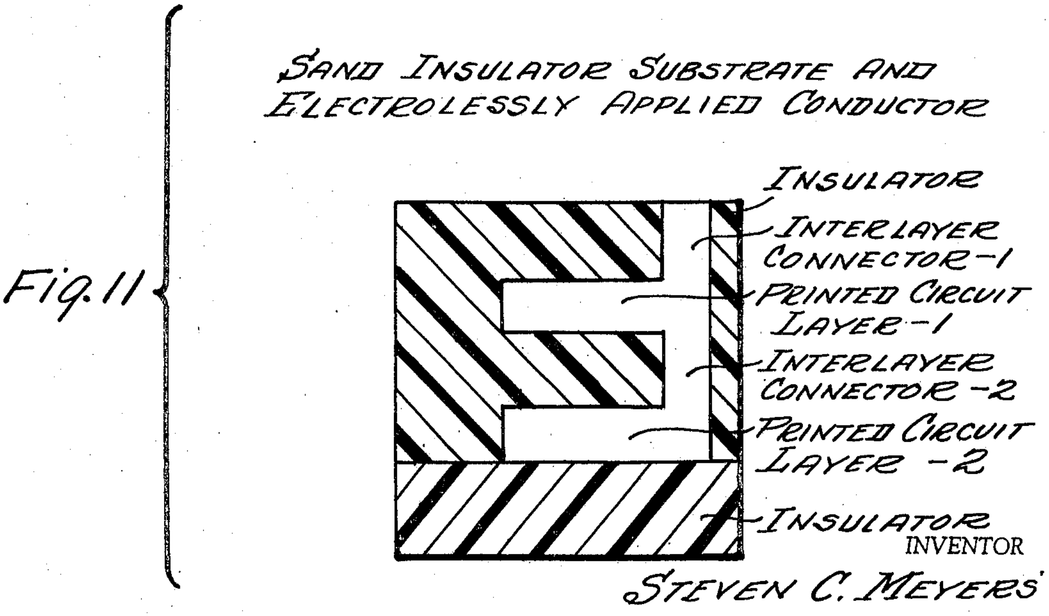

The details and scope of the invention will become more fully apparent when considered in light of the following description of an illustrative embodiment of the invention and from the appended claims. The invention may best be described by reference to the following drawings wherein:

FIGURES 1 and 2 diagrammatically represent the steps for forming a first printed circuit layer according to a first embodiment of the invention;

FIGURES 3–5 diagrammatically represent the steps for forming an interlayer connector according to the first embodiment of the invention;

FIGURE 6 diagrammatically represents the step performed in preparation for forming a second printed circuit layer according to the first embodiment of the invention;

FIGURE 7 diagrammatically represents a complete multilayer printed circuit board having interlayer connectors developed according to the first embodiment of the invention;

FIGURE 8 diagrammatically represents the steps for forming an interlayer connector according to a second embodiment of the invention;

FIGURE 9 diagrammatically represents the remaining steps for insulating the interlayer connector formed according to FIGURE 8;

FIGURE 10 diagrammatically illustrates the steps for forming a plurality of interconnected printed circuit layers according to the second embodiment of the invention; and FIGURE 11 diagrammatically represents a complete multilayer printed circuit board having interlayer connectors developed according to the second embodiment of the invention.

Referring now to the drawings, the invention will be described in detail. FIGURE 1 illustrates the arrangement by which the first of the multilayers of printed circuits is formed. This includes a substrate of insulator material upon which a layer of conductive material, such as copper, is adhered. The conductor is coated with a suitable masking material which permits selective removal of the conductor to leave a printed circuit layer on the substrate. In the embodiment shown, the mask is a conventional photo resist material which is selectively exposed to light in a pattern conforming with the printed circuit to be produced. Such photo resist materials react to light such that the unexposed areas can be removed with a standard developer. On application of the developer, followed by an etching step, a first printed circuit is formed on the substrate. This result is shown in FIGURE 2.

After the first printed circuit layer is developed, the exposed photo resist, shown in FIGURE 2, is removed, and the printed circuit and exposed areas of the substrate are coated with a conductor such as copper. The conductor may be applied electrolessly, may be vacuum deposited, or may be applied in many other ways familiar to those skilled in the art. For the purposes of the present description, an electroless plating method is described and thought superior to the other techniques. This coating, illustrated in FIGURE 3, serves as an electrical path in a subsequent electroforming step. It may be on the order of fifty-millionths of an inch thick.

The construction of FIGURE 3 is then coated or covered with a masking material which conforms tightly to the contours of the printed circuit and which can be photo-developed in the pattern of one or more interlayer connectors or posts. Conformity with the printed circuit is a very important consideration dictating the choice of the masking material as it prevents leakage of the plating solution in the next step to be described. The masking material may be applied to conform closely with the contours of the printed circuit by means of hot rolling or pressing onto the circuit. A preferred masking material is a suitable electrically non-conductive, developable, photosensitive material, such as a sheet photopolymer, having a thickness at least as great as the height of a suitable post, typically about ten-thousandths of an inch. To form the post pattern, the masking material is photographically exposed and developed to leave apertures corresponding to the size and position of each interlayer connector desired. The resulting mask allows little or no leakage of the plating solution and forms a clear, well-defined pattern for electroplating.

FIGURE 4 illustrates the developed masking arrangement upon which an electroforming operation is performed. As stated previously, the electrolessly applied conductor serves as an electrical path and permits an interlayer connector of conductive material, such as copper, to be electroformed or built up as a post. Electroforming is used because it forms a metallurgical bond between layers and permits the posts to be formed in any desired thickness. Due to the nature of the plating process and the accurate manner with which the masks can be developed, the interlayer connectors can be produced with good definition having straight walls, a broad dimensional range, and excellent innermetallic bonds.

Following the electroforming step, the mask and the resultant exposed electrolessly applied conductor are removed. The remaining exposed printed circuitry of the first layer and the interlayer connector are insulated by a suitable non-conductive material, such as fiber glass epoxy. This is illustrated in FIGURE 5. The removal of the mask in favor of an improved insulator is an important step because many different purposes are served by the insulating material. For example, the fibers within the fiber glass epoxy physically and electrically strengthen the final board. In applications involving considerable voltage between boards, an insulator of a very high dielectric strength is desired. If the board will experience severe environmental conditions, insulators which maintain their physical and electrical characteristics under such circumstances are necessary. Known photo-sensitive masks do not insure these properties. Accordingly, the mask used in forming the interlayer connections is removed in favor of an improved insulator. After the board is so insulated, the top surface of the structure of FIGURE 5 is appropriately sanded in order to insure that the top surface of the interlayer connector is exposed so as to make contact with the next layer of printed circuitry, and to accurately dimension the assembly thickness.

FIGURE 6 illustrates the means by which a conductive layer for a second printed circuit layer is formed. This is accomplished in the illustrative embodiment by coating the top surface of the structure shown in FIGURE 5 with a thin layer of an electrolessly applied conductor. Again this conductor serves as an electrical path for an electroforming step by which additional conductive material is plated on the coating. Electroforming is used in this step because it provides a metallurgical bond. However, other methods may be employed for developing the conductive layer for the second printed circuit which is then formed in the manner described with reference to FIGURES 1 and 2. A second interlayer connector is subsequently developed according to the description given for FIGURES 3–5, the resultant multilayer printed circuit board being illustrated in FIGURE 7.

If all of the interlayer posts are electrically connected to a first layer of circuitry, an alternative process may be employed to form a multilayer printed circuit board of the type illustrated in FIGURE 7. Such a process, illustrated in FIGURES 8–11, does not require an electrolessly applied conductor or electrical path for each layer. In carrying out this alternative process, a thin layer of an electrolessly applied conductor is coated onto an insulator substrate and a pattern of interlayer posts is formed in accordance with the procedure described with reference to FIGURE 4. Thereafter, however, only the masking material is removed, the vacated area being filled by a more suitable insulator. This is shown in FIGURE 9. Next a conductive layer interconnected with the post pattern is built up in accordance with the description given for FIGURE 6. A printed circuit is formed in this conductive layer, and an additional post pattern is developed using the same electrolessly applied conductor. No additional electrolessly applied layer over the printed circuit is necessary to electroform the posts. These steps are repeated until the desired number of layers are produced. Thereupon, an insulator is added to cover the exposed portions of the uppermost printed circuit layer, as illustrated in FIGURE 10. The insulator substrate and the electrolessly applied conductive layer are subsequently removed by sanding to the level of the bottom of the first formed interlayer connectors thereby exposing the ends of these posts. By this alternative process, the last layer fabricated corresponds to the first printed circuit developed according to the method described with reference to FIGURES 1–7. Similarly, the first layer formed by the alternative method corresponds to the top layer shown in FIGURE 7. The final product is illustrated in FIGURE 11.

In light of the foregoing description, it is apparent that by appropriate electroforming and sanding, either of the methods described hereinbefore may also be utilized to produce a multilayer printed circuit board having interlayer connectors, or posts, which are exposed on both surfaces of the multilayer board.

Although in the illustrative embodiments etching is described as producing the printed circuit layers, it should be appreciated that other conventional methods of forming the printed circuits could also be employed. In fact, even an electroforming operation could be utilized, such a step being analogous to that described in FIGURE 4 wherein an interlayer connector was formed by selectively masking a coating of electroless conductor and plating on the conductor in conformity with the mask.

It also should be appreciated that not all the interlayer connectors need continue through the board as illustrated in FIGURES 7 and 11. Any pattern may be constructed. For example, in some cases it may be desirable that some interlayer posts continue through the board in order that they may be exposed for contact purposes or for drilling to accommodate component leads or wires, whereas other interlayer posts may merely provide an electrical connection between certain layers within the multilayer board.

An added feature of the present invention is that it is capable of resulting in a weldable printed circuit board.

For such application the final post layer to a surface of the board is electroformed using a readily weldable material, such as nickel, instead of the conventional post material, copper. A more versatile board is produced in this manner.

The arrangements disclosed herein are examples of ones in which the inventive features of this disclosure may be utilized, and it will become apparent to one skilled in the art that certain modifications may be made within the spirit of the invention as defined by the appended claims.

What is claimed is:

1. A method of fabricating portions of a multilayer printed circuit board, comprising the steps of:
forming a conductive layer of material on an insulator substrate;
conforming a developable masking material to said conductive layer;
developing the masking material in a desired pattern;
electroforming at least one interlayer connector according to the masking pattern using said conductive layer as an electrical path in the electroforming operation;
removing the masking material; and
insulating the conductive layer and the interlayer connector, leaving an exposed surface at the end of said connector.

2. The method of claim 1, further comprising the steps of:
forming an additional conductive layer at the exposed surface of a connector; and
electroforming at least one additional interlayer connector from said additional conductive layer using the first-mentioned conductive layer as an electrical path in the electroforming operation.

3. The method of claim 2, wherein said additional conductive layer is electroformed as a printed circuit.

4. The method of claim 1, wherein said conductive layer includes a printed circuit covering a portion of said insulator substrate, the method including the further step of:
removing the conductive layer, other than said printed circuit portion thereof, left exposed after removal of the masking material and prior to the insulating step.

5. A method of fabricating an individual layer of a multilayer printed circuit board, comprising the steps of:
forming a printed circuit on an insulator substrate;
coating said printed circuit with a thin conductive layer of material;
conforming a masking material to the contours of the conductive layer;

forming apertures in said masking material in the desired pattern of at least one interlayer connector;
electroforming said connector using said conductive layer as an electrical path in the electroforming operation;
removing the masking material and the resultant exposed material of the conductive layer; and
insulating the printed circuit and the interlayer connector, leaving an exposed surface at the end of said connector.

6. A method as set forth in claim 5, wherein said conductive layer is masked with an electrically nonconductive, photosensitive material which is selectively exposed and developed to form an aperture therein in the configuration of the connector.

7. A method as set forth in claim 5, wherein said printed circuit is formed by selectively etching an additional layer of conductive material adhered to said substrate.

8. A method as set forth in claim 5, wherein said interlayer connector is formed of a weldable material.

9. A method of fabricating interlayer connectors for a multilayer printed circuit board, comprising the steps of:
conforming a developable masking material to a conductive layer of the multilayer printed circuit board;
developing the masking material in a pattern of desired interlayer connectors;
electroforming the desired interlayer connectors according to the mask;
removing the masking material; and
insulating the resulting exposed conducting layer and interlayer connectors.

10. A method as set forth in claim 9, wherein said conductive layer is masked with an electrically non-conductive, photosensitive material which is selectively exposed and developed in the configuration of the connectors.

References Cited

UNITED STATES PATENTS

| | | | |
|---|---|---|---|
| 3,152,938 | 10/1964 | Osifchin et al. | 204—15 |
| 3,301,939 | 1/1967 | Krasnow | 204—15 |
| 3,319,317 | 5/1967 | Roche et al. | 204—15 |
| 3,325,379 | 6/1967 | Bussolini et al. | 204—15 |
| 3,340,607 | 9/1967 | Shutt | 204—15 |
| 3,436,819 | 4/1969 | Lunine | 204—15 |

JOHN H. MACK, Primary Examiner

T. TUFARIELLO, Assistant Examiner